US009507892B2

(12) United States Patent
Ashcraft et al.

(10) Patent No.: US 9,507,892 B2
(45) Date of Patent: Nov. 29, 2016

(54) METHODS AND SYSTEMS FOR USING BI-DIRECTIONAL LEVEL SETS TO PARTITION AN UNDIRECTED GRAPH REPRESENTING A MATRIX TO BE USED IN CAE

(71) Applicant: Livermore Software Technology Corporation, Livermore, CA (US)

(72) Inventors: Cleve Ashcraft, Kingston, ID (US); Roger Grimes, Fall City, WA (US)

(73) Assignee: Livermore Software Technology Corp., Livermore, CA (US)

( * ) Notice: Subject to any disclaimer, the term of this patent is extended or adjusted under 35 U.S.C. 154(b) by 651 days.

(21) Appl. No.: 13/971,642

(22) Filed: Aug. 20, 2013

(65) Prior Publication Data

US 2014/0343899 A1 Nov. 20, 2014

Related U.S. Application Data

(60) Provisional application No. 61/823,217, filed on May 14, 2013.

(51) Int. Cl.
*G06F 17/50* (2006.01)
*G06T 19/00* (2011.01)

(52) U.S. Cl.
CPC .................................. *G06F 17/5018* (2013.01)

(58) Field of Classification Search
CPC ............... G06F 17/5009; G06F 17/50; G06F 17/5018; G06F 2217/16
USPC ........................................................... 703/1, 2
See application file for complete search history.

(56) References Cited

U.S. PATENT DOCUMENTS 8,711,146 B1 * 4/2014 Miller ..................... G06F 17/10 345/440

OTHER PUBLICATIONS

Liu et al. "A distributed memory parallel element-by-element scheme based Jacobi-conditioned conjugate gradient for 3D finite element analysis", Finite Elements in Analysis and Design 43 (2007) 494-503, Elsevier B.V.*
Karypis et al. "Multilevel k-way Partitioning Scheme for irregular Graphs", Journal of Parallel and Distributed Computing 48, 96-129 (1998).*

(Continued)

*Primary Examiner* — Omar Fernandez Rivas
*Assistant Examiner* — Shiuh-Huei Ku
(74) *Attorney, Agent, or Firm* — Roger H. Chu

(57) ABSTRACT

An N×N matrix is generated from computerized model representing a physical domain, comprises coefficients of N simultaneous linear equations with N unknown physical quantities associated with N degrees-of-freedom of the physical domain, and is represented by an undirected graph having N vertices connected by a plurality of edges. A best suitable partition scheme for dividing the N vertices into a separator group and, first and second mutually independent groups as follows: distance vectors of source vertices selected from the N vertices are calculated; for each distinct pair of the source vertices, the difference of respective distance vectors is used for finding a coarse graph whose adjacency coarse matrix is pentadiagonal; a trial partition scheme is determined using the coarse graph initially; the separator group is then iteratively improved by trimming vertices contained therein and merging them into one of the mutually independent groups until the separator group becomes minimal.

20 Claims, 10 Drawing Sheets

(56) References Cited

OTHER PUBLICATIONS

Grimes et al "A New Algorithm for Finding a Pseudoperipheral Node in a Graph", SIAM Journal on Matrix Analysis and Applications, vol. 2, No. 2, pp. 323-334, Apr. 1990.*

Ashcraft et al. "Using domain decomposition to find path bisectors", BIT Numerical Mathematics, Sep. 1997, vol. 37, issue 3, pp. 506-534.*

Liu et al. "A distributed memory parallel element-by-element scheme based on Jacobi-conditioned conjugate gradient for 3D finite element analysis", Finite Elements in Analysis and Design 43 (2007) 494-503, Elsevier B.V.*

Karypis et al "Multilevel k-way Partitioning Scheme for Irregular Graphs", Journel of Parallel and Distributed Computing 48, 96-129 (1998).*

Grimes et al. "A New Algorithm for Finding a Pseudoperipheral Node in a Graph", SIAM Journel on Matrix Analysis and Applications, vol. 2, No. 2, pp. 323-334, Apr. 1990.*

Ashcraft et al. "Using domain decomposition to find graph bisectors", BIT Numerical Mathematics, Sep. 1997, vol. 37, Issue 3, pp. 506-534.*

Alan Georage "Nested Dissection of a Regular Finite Element Mesh" SIAM Journal on Numerical Analysis, vol. 1, No. 2, (Apr. 1973), 345-363.

* cited by examiner $$
\begin{bmatrix} N^i \\ V_2^i \\ V_3^i \\ T^i \\ M_2^i \\ M_3^i \\ \hline N^j \\ V_2^j \\ V_3^j \\ T^j \\ M_2^j \\ M_3^j \end{bmatrix}
=
\left[\begin{array}{cccccc|cccccc}
\frac{EA}{L} & 0 & 0 & 0 & 0 & 0 & -\frac{EA}{L} & 0 & 0 & 0 & 0 & 0 \\
0 & \frac{12EI_3}{L^3} & 0 & 0 & 0 & \frac{6EI_3}{L^2} & 0 & -\frac{12EI_3}{L^3} & 0 & 0 & 0 & \frac{6EI_3}{L^2} \\
0 & 0 & \frac{12EI_2}{L^3} & 0 & -\frac{6EI_2}{L^2} & 0 & 0 & 0 & -\frac{12EI_2}{L^3} & 0 & -\frac{6EI_2}{L^2} & 0 \\
0 & 0 & 0 & \frac{GJ}{L} & 0 & 0 & 0 & 0 & 0 & -\frac{GJ}{L} & 0 & 0 \\
0 & 0 & -\frac{6EI_2}{L^2} & 0 & \frac{4EI_2}{L} & 0 & 0 & 0 & \frac{6EI_2}{L^2} & 0 & \frac{2EI_2}{L} & 0 \\
0 & \frac{6EI_3}{L^2} & 0 & 0 & 0 & \frac{4EI_3}{L} & 0 & -\frac{6EI_3}{L^2} & 0 & 0 & 0 & \frac{2EI_3}{L} \\
\hline
-\frac{EA}{L} & 0 & 0 & 0 & 0 & 0 & \frac{EA}{L} & 0 & 0 & 0 & 0 & 0 \\
0 & -\frac{12EI_3}{L^3} & 0 & 0 & 0 & -\frac{6EI_3}{L^2} & 0 & \frac{12EI_3}{L^3} & 0 & 0 & 0 & -\frac{6EI_3}{L^2} \\
0 & 0 & -\frac{12EI_2}{L^3} & 0 & \frac{6EI_2}{L^2} & 0 & 0 & 0 & \frac{12EI_2}{L^3} & 0 & \frac{6EI_2}{L^2} & 0 \\
0 & 0 & 0 & -\frac{GJ}{L} & 0 & 0 & 0 & 0 & 0 & \frac{GJ}{L} & 0 & 0 \\
0 & 0 & -\frac{6EI_2}{L^2} & 0 & \frac{2EI_2}{L} & 0 & 0 & 0 & \frac{6EI_2}{L^2} & 0 & \frac{4EI_2}{L} & 0 \\
0 & \frac{6EI_3}{L^2} & 0 & 0 & 0 & \frac{2EI_3}{L} & 0 & -\frac{6EI_3}{L^2} & 0 & 0 & 0 & \frac{4EI_3}{L}
\end{array}\right]
\begin{bmatrix} u_1^i \\ u_2^i \\ u_3^i \\ \theta_1^i \\ \theta_2^i \\ \theta_3^i \\ \hline u_1^j \\ u_2^j \\ u_3^j \\ \theta_1^j \\ \theta_2^j \\ \theta_3^j \end{bmatrix}
$$

METHODS AND SYSTEMS FOR USING BI-DIRECTIONAL LEVEL SETS TO PARTITION AN UNDIRECTED GRAPH REPRESENTING A MATRIX TO BE USED IN CAE

FIELD OF THE INVENTION

The present invention generally relates to methods, systems and software product used in computer-aided engineering analysis (CAE), more particularly to methods and systems for using bi-directional level sets to partition an undirected graph representing a matrix used in CAE analysis (e.g. implicit finite element analysis (FEA), boundary element analysis, etc.) of a physical domain (e.g., a product such as car, airplane, and/or their components) in a distributed memory multi-processor computer system.

BACKGROUND OF THE INVENTION

Finite element analysis (FEA) is one of the popular CAE analyses widely used in industry to model and solve engineering problems related to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The corners of the elements are referred to as nodes. Each node has 6-degrees of freedom in three-dimensional space. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

There are two types of FEA software—explicit and implicit. The present invention is related to implicit FEA software, which requires solving a system of simultaneous linear equations with one equation representing each degree-of-freedom. For example, a static analysis involves solving N simultaneous linear equations represented by an N×N stiffness matrix with N unknown displacements and N nodal forces and/or moments as the right hand side of the simultaneous linear equations. N is a positive integer. With the improvement of the finite element software and computer hardware technologies, many today's FEA model includes huge number of unknowns (e.g., often in the order of millions). The N×N matrix for a FEA model is sparse (i.e., there are many zeros). A number of techniques have been used to improve the performance of solving such a matrix both in serial and parallel computations. In a distributed memory multi-processor computer system, one of the keys to improve sparse matrix solver performance is to partition the matrix in a partition scheme that can reduce the inter-processor communications. However, partitioning a large sparse matrix is not an easy task. Prior art approaches are generally based on "Nested Dissection of a Regular Finite Element Mesh" by Alan George, SIAM Journal on Numerical Analysis, Vol. 10, No. 2. April 1973.

However the prior art approaches do not work well in a distributed memory computer system. Therefore, it would be desirable to have improved methods and systems for partitioning a graph representing a matrix to be used in CAE analysis of a physical domain in a distributed memory multi-processor computer system.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

Methods and systems for numerically simulating physical behaviors of a physical domain using CAE analysis in a distributed memory multi-processor computer system are disclosed. According to one exemplary embodiment of the present invention, a computerized model (e.g., an unstructured finite element analysis model) representing the physical domain (e.g., a product such as car, airplane, etc.) is defined and received in the computer system. An N×N matrix is generated from the computerized model for representing a physical characteristic property (e.g., stiffness) of the physical domain, where the N×N matrix comprises coefficients of N simultaneous linear equations with N unknown physical quantities (e.g., N nodal displacements at respective degrees-of-freedom, N is a positive integer) of the physical domain. The matrix is then represented by an undirected graph having N vertices connected by a plurality of edges. Each vertex corresponds to a degree-of-freedom and each edge represents a non-zero term in the matrix.

In order to efficiently perform a CAE analysis in a distributed memory multi-processor computer system, a best suitable partition scheme is determined for dividing the N vertices into a separator group and, first and second mutually independent groups. Vertices in the first independent group are not connected to those in the second independent group by any edge. According one aspect of the present invention, a group of source vertices is selected from the N vertices (e.g., arbitrarily selected in random). Then respective distance vectors of the source vertices are calculated. A distance vector is a minimum path length between two vertices in the graph. For each distinct pair of the source vertices, a half-level set (i.e., the difference of respective distance vectors) is used to find a coarse graph whose adjacency coarse matrix is pentadiagonal; a trial partition scheme is determined using the coarse graph initially; the separator group is then improved by trimming one or more vertices contained therein and merging them into either one of the first and second mutually independent groups until the separator group becomes minimal. Finally, the best suitable partition scheme is determined by comparing all of the trial partition schemes in accordance with a user defined criterion, which is configured to reduce the overall computing resources of solving the N simultaneous linear equations in the distributed memory multi-processor computer system (e.g., inter-processor communications). This partitioning is applied recursively until the size of the resulting partition is appropriate for the computer environment used to solve the system of simultaneous linear equations, for example, the number of processors, the size of local memory for each processor, etc. The simulated physical behaviors (e.g., structural behaviors) are obtained by solving the N×N simultaneous linear equations in a CAE analysis in the computer system with the N×N matrix stored according to the best suitable partition scheme.

Objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 5A is a diagram showing a stiffness matrix of an exemplary finite element;

DETAILED DESCRIPTION OF THE PREFERRED EMBODIMENTS

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-6B. However, those skilled in the art will readily appreciate that the detailed description given herein with respect to these figures is for explanatory purposes as the invention extends beyond these limited embodiments.

The present invention is related to methods and systems for numerically simulating physical behaviors of a physical domain using CAE analysis in a distributed memory multi-processor computer system.

Figure 1A:
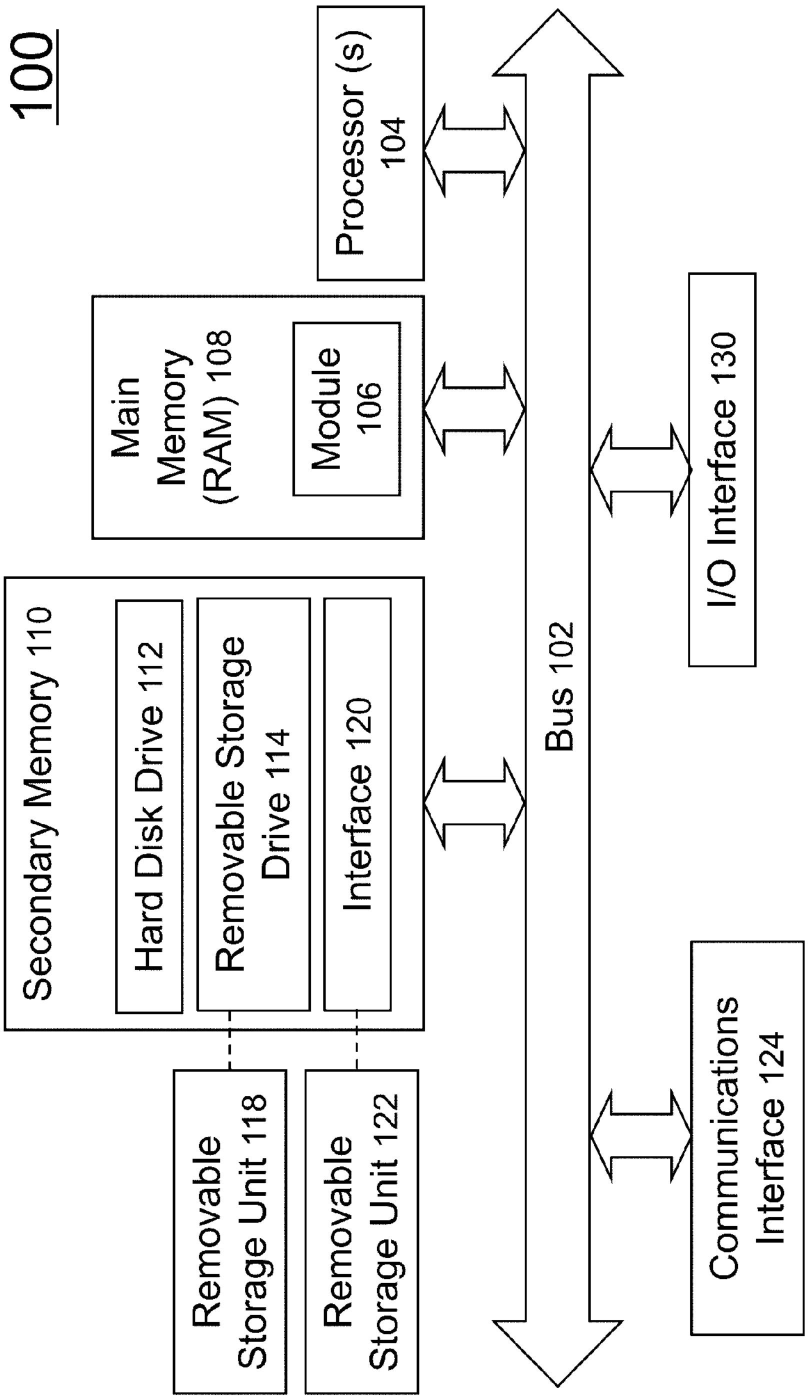
FIG. 1A is a function block diagram showing salient components of an exemplary computer system, in which an embodiment of the present invention may be implemented.

An example of a computer system 100 is shown in FIG. 1A. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services.

There may also be a communications interface 124 connecting to the bus 102. Communications interface 124 allows software and data to be transferred between computer system 100 and external devices. Examples of communications interface 124 may include a modem, a network interface (such as an Ethernet card), a communications port, a PCMCIA slot and card, etc.

The channel facilitates a data flow between a data network and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer readable storage medium" and "computer usable medium" are used to generally refer to media such as removable storage drive 114, a hard disk installed in hard disk drive 112. These computer program products are means for providing software to computer system 100. The invention is directed to such computer program products.

The computer system 100 may also include an I/O interface 130, which provides the computer system 100 to access monitor, keyboard, mouse, printer, scanner, plotter, and alike.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform the features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results are computed and stored in the secondary memory 110 (i.e., hard disk drive 112). The status of the computation (e.g., progress of a CAE analysis) is reported to the user via the I/O interface 130. The status may be shown graphically for visual inspection. The graphical output is sent through the I/O interface 130 to a monitor.

Figure 1B:
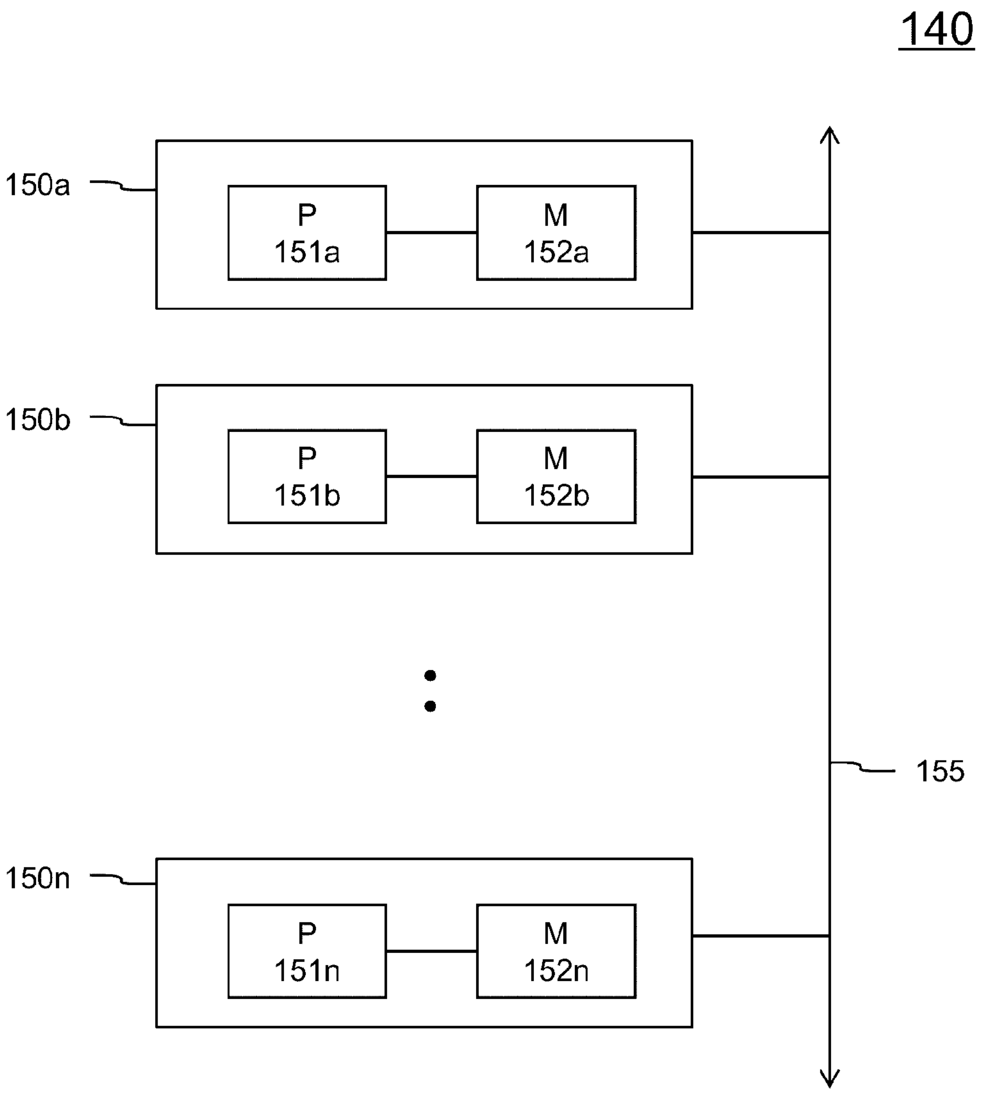
FIG. 1B is a block diagram showing an exemplary distributed memory multi-processor computer system.

FIG. 1B shows an exemplary distributed memory multi-processor computer system 140, in which an embodiment of the present invention may be implemented. The distributed memory multi-processor computer system 140 contains a plurality of computing units 150*a*-150*n* operatively adapted to one another via a communication link 155 (e.g., Ethernet, Internet, etc.). Each of the computing units 150*a*-150*n* contains its own processor 151*a*-151*n* and memory 152*a*-152*n*. Because the memories 152*a*-152*n* are distributed, the relatively slower data communication via the link 155 is a bottleneck to be avoided in the present invention.

Figure 2A:
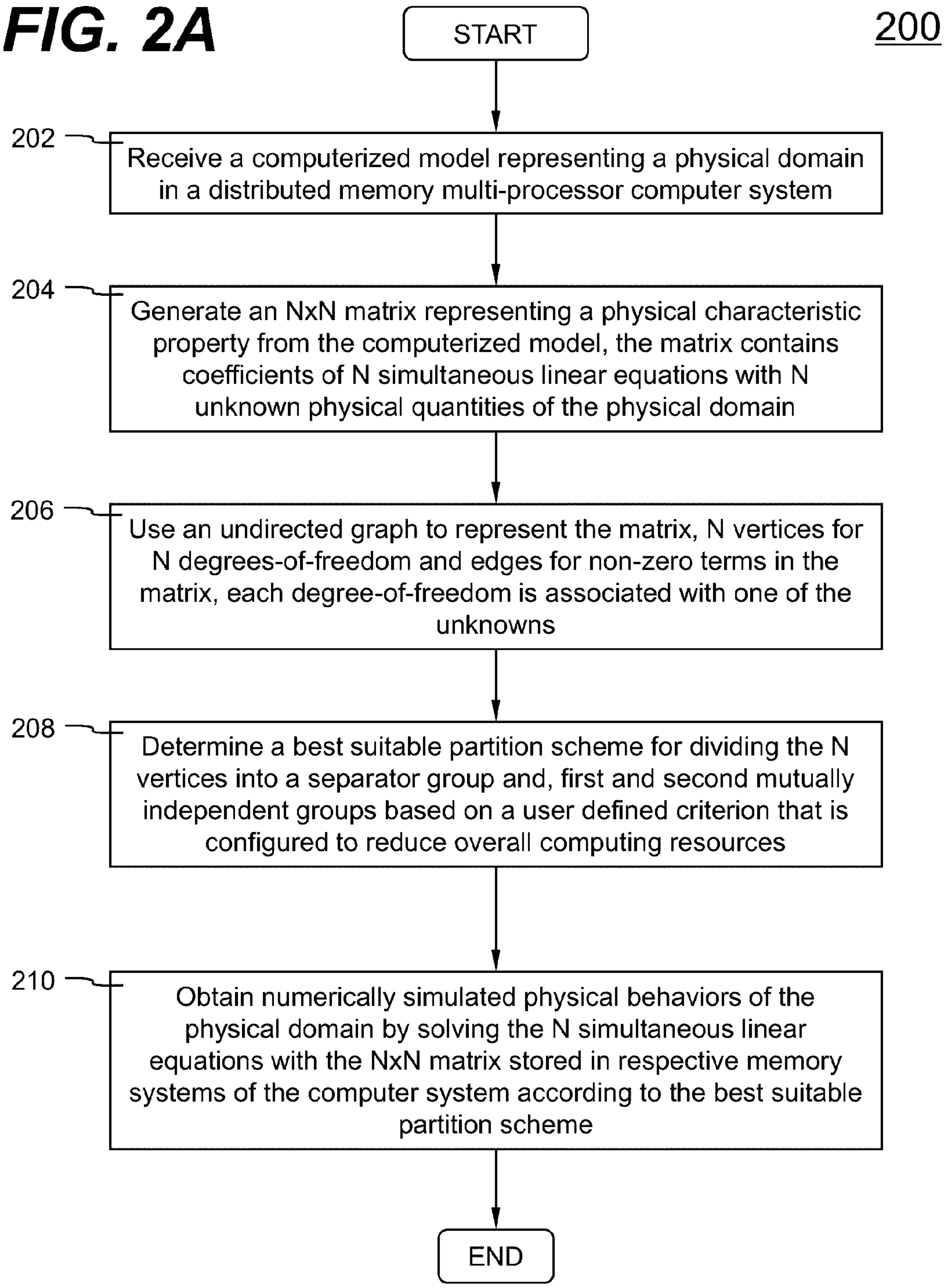
FIGS. 2A and 2B collectively show a flowchart illustrating an exemplary process of using bi-directional level sets to partition a undirected graph representing a matrix used in CAE analysis of a physical domain, according to an embodiment of the present invention.
Figure 2B:
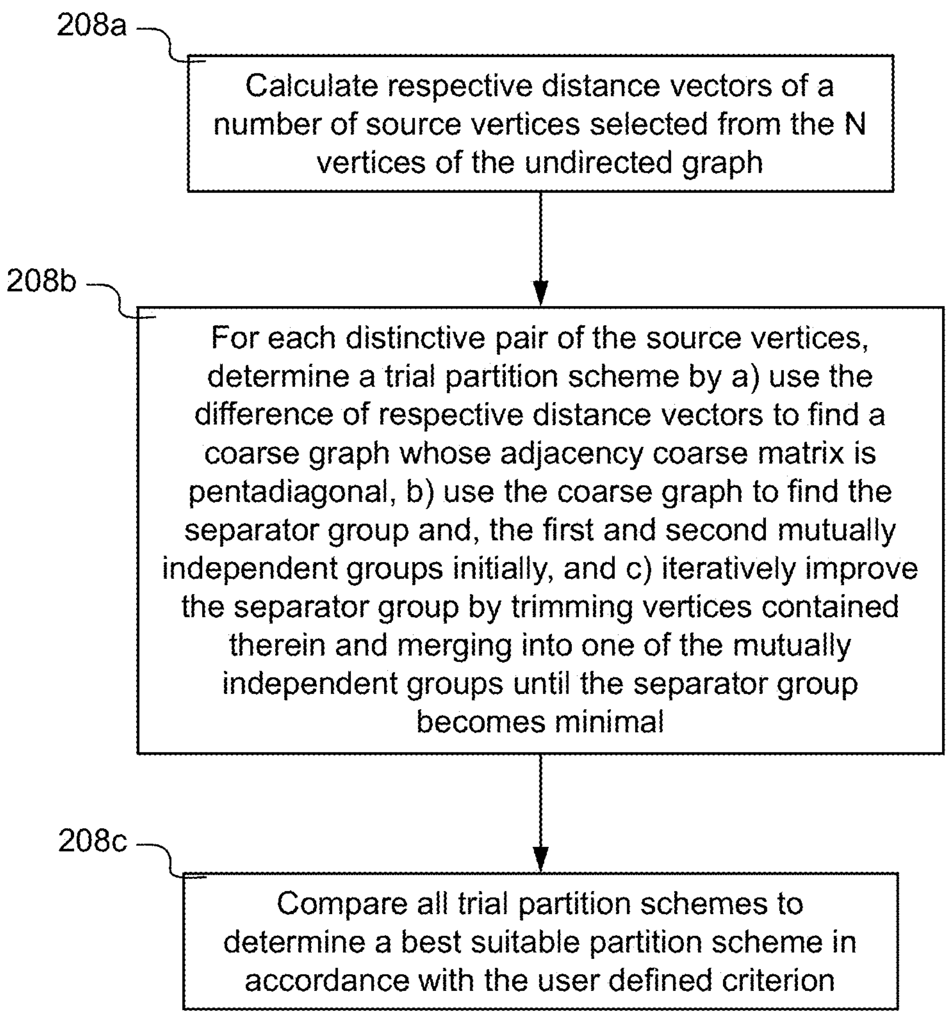
Figure 3:
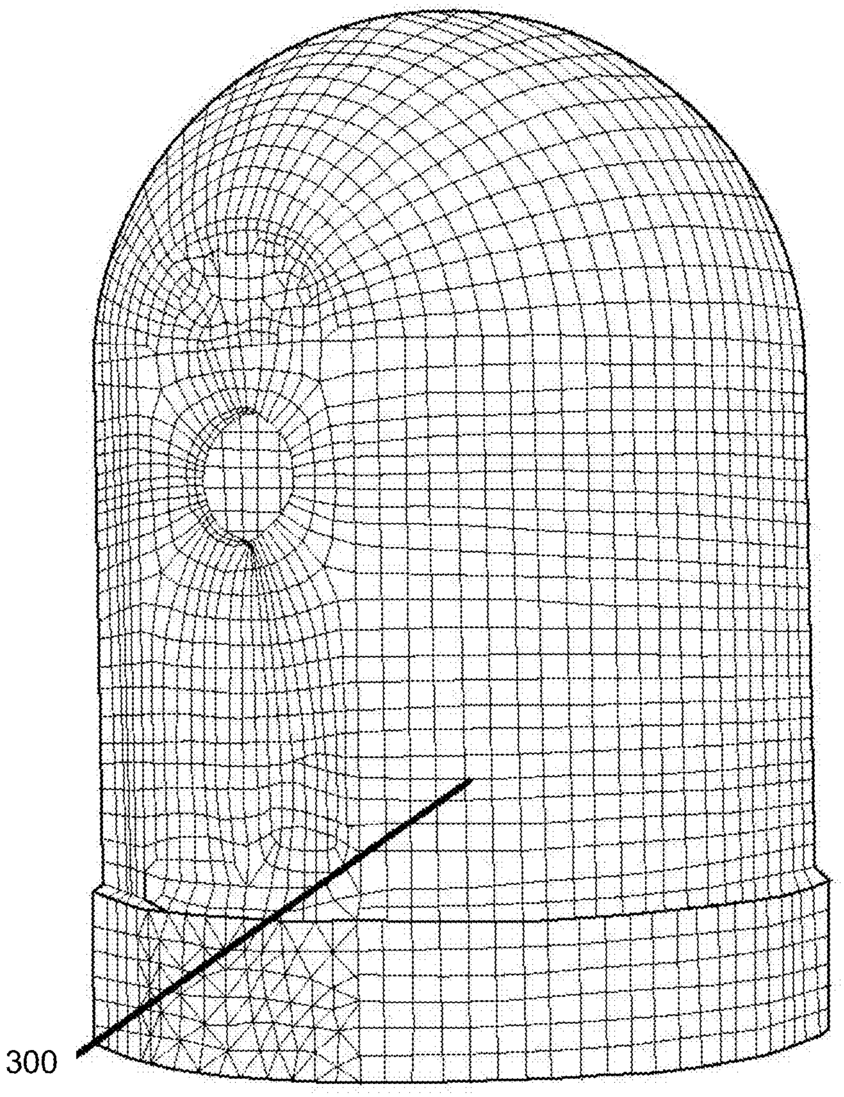
FIG. 3 is a diagram showing an exemplary FEA model of a physical domain.

Referring now to FIGS. 2A and 2B, a flowchart illustrating an exemplary process 200 of numerically simulating physical behaviors of a physical domain using a CAE analysis in a distributed memory multi-processor computer system is shown, according to an embodiment of the present invention. Process 200 is preferably implemented in software and understood with other figures.

Figure 4:
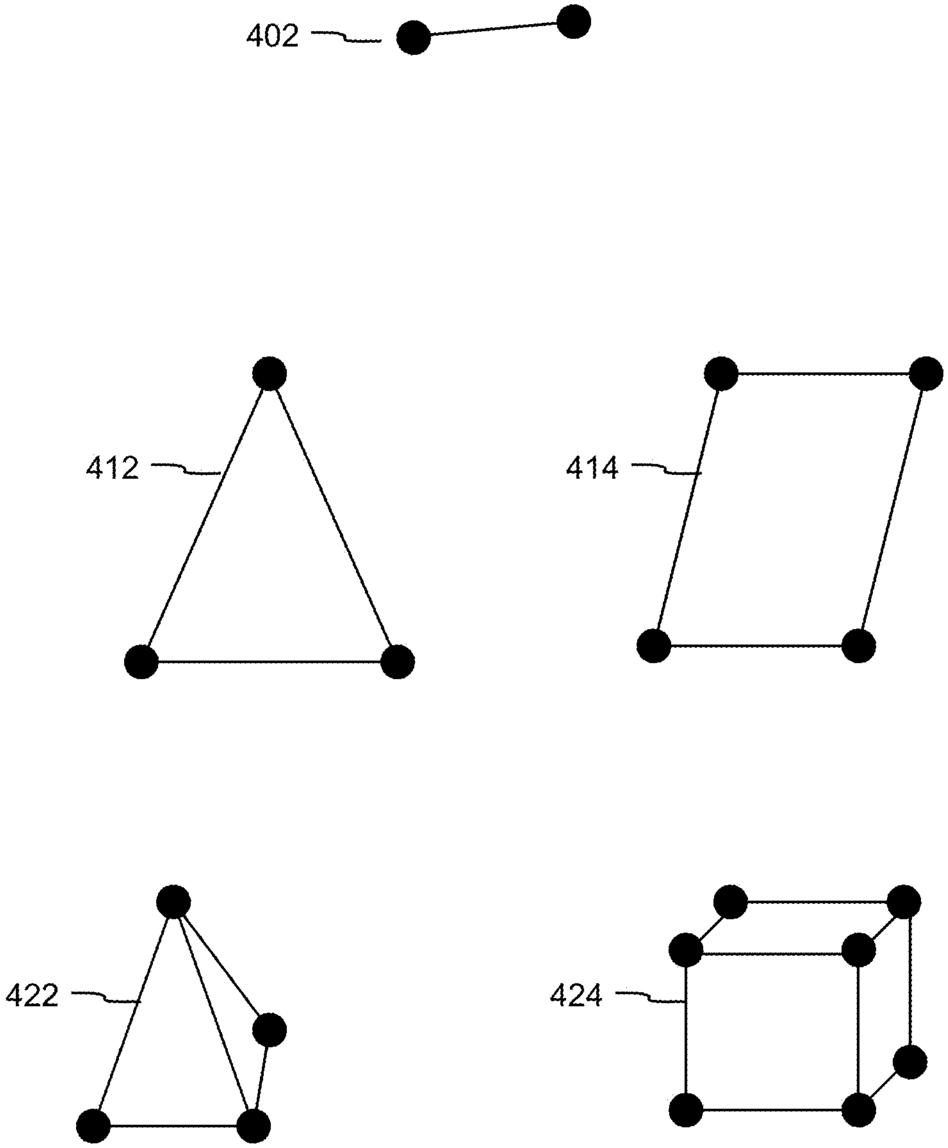
FIG. 4 is a diagram showing various exemplary finite elements.

Process 200 starts at step 202 by receiving a computerized model of a physical domain in a distributed memory multi-processor computer system (e.g., computer system 140 shown in FIG. 1B). In one embodiment, computerized model can be a FEA model 300 having a plurality of nodes connected by a plurality of finite elements in unstructured manner shown in FIG. 3. FIG. 4 shows various exemplary types of finite elements that can be used: 1-dimensional beam or truss element 402, 2-dimensional triangular element 412, 2-dimensional quadrilateral element 414, 3-dimensional tetrahedral element 422 and 3-dimensional hexahedral element 424.

Physical domain can be a product (e.g., car, airplane and/or their components). In another embodiment, computerized model can be a boundary element method (BEM) model containing a plurality of nodes connected by a plurality of BEM faces. Physical domain can be the fluid or air enclosed by the BEM model.

Figure 5B:
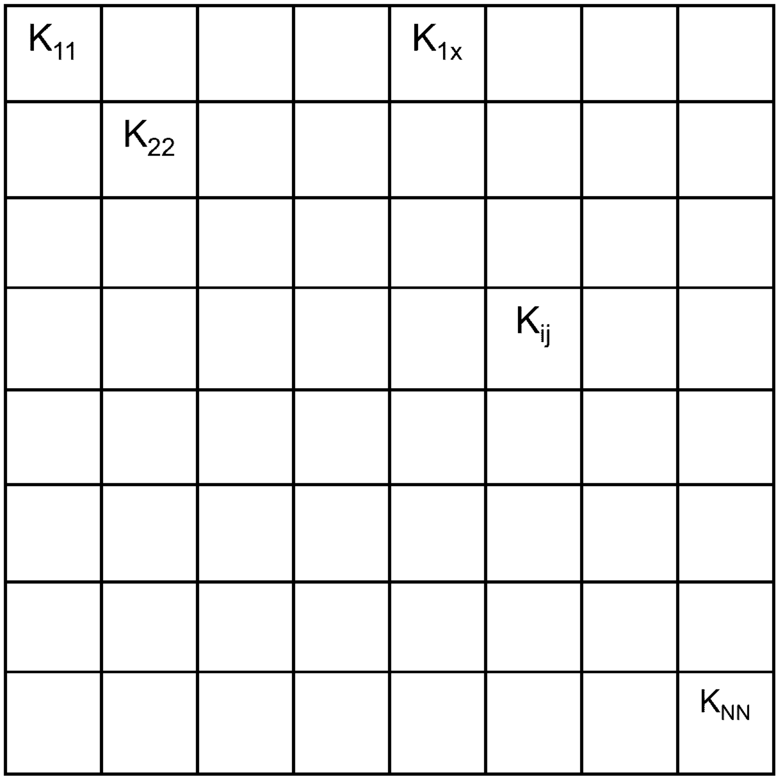
FIG. 5B is a diagram showing a simplified matrix representing an exemplary physical property of a physical domain in accordance with one embodiment of the present invention.

At step 204, an N×N matrix represent a physical characteristic property of the physical domain is generated from the computerized model using an application module installed on the computer system. One exemplary physical characteristic property is the stiffness. N is a positive integer and N represents the number of degree-of-freedom in the computerized model. The N×N matrix contains coefficients of N simultaneous linear equations with N unknown physical quantities of the physical domain. One example of the unknown physical quantities is nodal displacement of the computerized model. An exemplary stiffness matrix 510 is shown in FIG. 5A. Unknown nodal displacements 512 are at six degrees-of-freedom for each node. The matrix 510 is for a beam element (e.g., element 402 of FIG. 4). Element stiffness matrices are assembled into a global stiffness matrix. A simplified matrix 550 having N degrees-of-freedom is shown in FIG. 5B. A typical stiffness matrix generated from a FEA model is generally sparse (i.e., many of the off-diagonal terms are zeros).

Figure 6A:
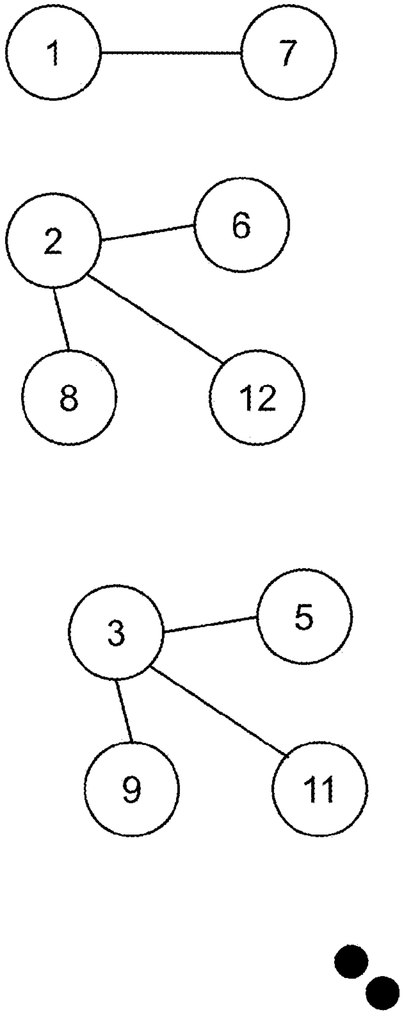
FIG. 6A is a diagram showing exemplary graphs representing the element stiffness matrix shown in FIG. 5A.
Figure 6B:
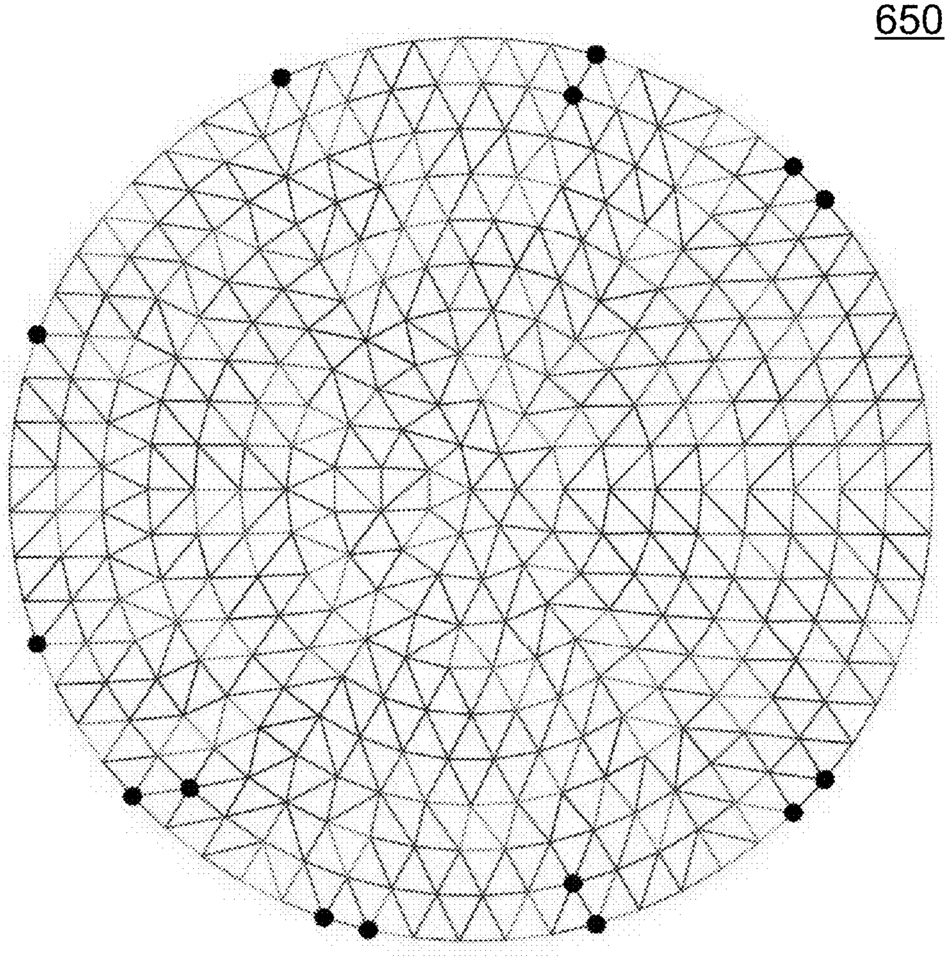
FIG. 6B is a diagram showing an exemplary undirected graph in accordance with one embodiment of the present invention.

Next, at step 206, an undirected graph is used to represent the N×N matrix. The undirected graph contains N vertices connected by a plurality of edges. Each vertex corresponds to one of the N unknown physical quantities associated with respective N degrees-of-freedom. Each edge represents a non-zero term in the N×N matrix. FIG. 6A shows exemplary graphs for element stiffness matrix 510 of FIG. 5A. An exemplary undirected graph 650 is shown in FIG. 6B.

In order to efficiently solving the N simultaneous linear equations in the distributed memory multi-processor computer system, the N×N matrix needs to be stored in a partition scheme that minimizes computing resources such as inter-processor communications, storage and computational power (e.g., number of processors) thereby reducing the computational time. At step 208, a best suitable partition scheme for dividing the N vertices into a separator group and, first and second mutually independent groups in accordance with a user defined criterion that is configured to reduce computing resources. The best suitable partition scheme is determined with following steps.

At step 208*a*, respective distance vectors of a number of source vertices are calculated. According to one embodiment, the source vertices are chosen arbitrarily in random from the N vertices. The distance vector is the minimum path length between two vertices in the undirected graph. At step 208*b*, a trial partition scheme is determined for each distinct pair of the source vertices by a) using a half-level set (i.e., the difference of respective distance vectors) to find a coarse graph whose adjacency coarse matrix is pentadiagonal; b) initially finding the separator group and, first and second mutually independent groups using the coarse graph; and c) iteratively improving the separator group by trimming one or more vertices contained therein and merging them into one of the first and second mutually independent groups until the separator group becomes minimal. At step 208*c*, a best suitable partition scheme is determined by comparing all of the trial partition schemes in accordance with the user defined criterion that is configured to reduce overall computing resources (e.g., inter-processor communications between processors of a distributed memory multi-processor computer system).

One exemplary user defined criterion is based on the imbalance and the difference of the number of vertices in the first and second mutually independent groups.

$$imbalance=\max(|B|,|W|)/\min(|B|,|W|)$$

$$difference=abs(|B|-|W|)/(|B|+|W|+|S|)$$

where:

|B| is the number of vertices in the first mutually independent group.

|W| is the number of vertices in the second mutually independent group.

|S| is the number of vertices in the separator group.

To estimate the cost of computation for each trial partition scheme, two user provided parameters α and β are used in the following manner:

If imbalance<α then $$Cost=|S|(1+\beta\ difference)$$

else $$Cost=infinity$$

end

In one embodiment, α is 1.3 while β is 0.3.

Finally, at step 210, numerically simulated physical behaviors of the physical domain are obtained in a CAE analysis by solving for N unknowns of the N simultaneous linear equations with the N×N matrix stored in respective memory systems of the distributed memory multi-processor computer system according to the best suitable partition scheme.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the matrix representing physical characteristic of the product has been shown and described as the stiffness matrix, other physical characteristics can be used, for example, eigenvalue evaluation matrix. Further, implicit finite element method has been shown and described as the computer-aided engineering analysis, other types can be used, for example, boundary element method. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A computer-implemented method of numerically simulating physical behaviors of a physical domain using a computer-aided engineering (CAE) analysis, the method comprising:

receiving a computerized model representing a physical domain in a distributed memory multi-processor computer system, the computerized model comprising a plurality of nodes connected by a plurality of elements in an unstructured manner, wherein the computerized model contains N degrees-of-freedom associated with the nodes, N is a positive integer;

generating an N×N matrix representing a physical characteristic property of the physical domain from the computerized model using a CAE application module installed on the distributed memory multi-processor computer system, wherein the N×N matrix comprises coefficients of N simultaneous linear equations with N unknown physical quantities of the physical domain, each unknown physical quantity being associated with one of the N degrees-of-freedom;

using an undirected graph containing N vertices connected by a plurality of edges to represent the N×N matrix, the N vertices corresponding to the respective N degrees-of-freedom while the edges representing respective non-zero terms in the N×N matrix;

calculating respective distance vectors of a plurality of source vertices selected from the N vertices;

for each distinct pair of the source vertices, determining a trial partition scheme for dividing the N vertices into a separator group and, first and second mutually independent groups by a) using a half-level set to find a coarse graph whose adjacency coarse matrix is pentadiagonal, the half-level set being the difference of said corresponding distance vectors of the distinct pair, b) initially determining the separator group and, the first and second mutually independent groups using the coarse graph, and c) iteratively improving the separator group by trimming vertices contained therein and merging into one of the first and the second mutually independent groups until the separator group becomes minimal, wherein the first and the second mutually independent groups are unconnected by any of the edges; and comparing all trial partition schemes to determine a best suitable partition scheme based on a user defined criterion that is configured to reduce overall computing resources for solving the N simultaneous linear equations; and obtaining numerically simulated physical behaviors of the physical domain by solving the N unknown physical quantities with the N×N matrix stored in corresponding memory systems of the distributed memory multi-processor computer system according to the best suitable partition scheme.

2. The method of claim 1, wherein said physical behaviors of the physical domain are structural behaviors of a product and said computerized model comprises a finite element analysis model with the elements comprising finite elements.

3. The method of claim 2, wherein the physical characteristic property of the physical domain is stiffness and the unknown physical quantities are displacements at the nodes of the finite element analysis model.

4. The method of claim 1, wherein said selecting a group of source vertices from the N vertices are selected arbitrarily in random.

5. The method of claim 1, wherein said distance vectors represent minimum path length between said distinct pair of source vertices in the undirected graph.

6. The method of claim 1, wherein the user defined criterion is based on imbalance and difference of the first and second mutually independent groups, wherein the imbalance and the difference are defined as follows:

$$imbalance=\max(|B|,|W|)/\min(|B|,|W|)$$

$$difference=abs(|B|-|W|)/(|B|+|W|+|S|)$$

where:

|B| is the number of vertices in the first independent group,

|W| is the number of vertices in the second independent group,

|S| is the number of vertices in the separator group.

7. The method of claim 6, wherein the user defined criterion further includes first and second user provided parameters for estimating a computational cost indicator of a particular partition scheme as follows: if said imbalance is less than the first parameter, then the computational cost indicator is equal to |S|(1+said difference×the second parameter), otherwise the computational cost indicator is infinite.

8. A system for numerically simulating physical behaviors of a physical domain using a computer-aided engineering (CAE) analysis, the system comprising:

at least one processor having at least one memory system with a CAE application module containing computer readable code being stored on the memory system, when executed in said at least one processor causing the CAE application module to perform operations by a method of:

receiving a computerized model representing a physical domain, the computerized model comprising a plurality of nodes connected by a plurality of elements in an unstructured manner, wherein the computerized model contains N degrees-of-freedom that are associated with the nodes, N is a positive integer;

generating an N×N matrix representing a physical characteristic property of the physical domain from the computerized model, wherein the N×N matrix comprises coefficients of N simultaneous linear equations with N unknown physical quantities of the physical domain, each unknown physical quantity being associated with one of the N degrees-of-freedom;

using an undirected graph containing N vertices connected by a plurality of edges to represent the N×N matrix, the N vertices corresponding to the respective N degrees-of-freedom while the edges representing respective non-zero terms in the N×N matrix;

calculating respective distance vectors of a plurality of source vertices selected from the N vertices;

for each distinct pair of the source vertices, determining a trial partition scheme for dividing the N vertices into a separator group and, first and second mutually independent groups by a) using a half-level set to find a coarse graph whose adjacency coarse matrix is pentadiagonal, the half-level set being the difference of said corresponding distance vectors of the distinct pair, b) initially determining the separator group and, the first and second mutually independent groups using the coarse graph, and c) iteratively improving the separator group by trimming vertices contained therein and merging into one of the first and the second mutually independent groups until the separator group becomes minimal, wherein the first and the second mutually independent groups are unconnected by any of the edges; and comparing all trial partition schemes to determine a best suitable partition scheme based on a user defined criterion that is configured to reduce overall computing resources for solving the N simultaneous linear equations; and obtaining numerically simulated physical behaviors of the physical domain by solving the N unknown physical quantities with the N×N matrix stored in the first and the second memory systems according to the best suitable partition scheme.

9. The system of claim 8, wherein said physical behaviors of the physical domain are structural behaviors of a product and said computerized model comprises a finite element analysis model with the elements comprising finite elements.

10. The system of claim 9, wherein the physical characteristic property of the physical domain is stiffness and the unknown physical quantities are displacements at the nodes of the finite element analysis model.

11. The system of claim 8, wherein said selecting a group of source vertices from the N vertices are selected arbitrarily in random.

12. The system of claim 8, wherein said distance vectors represent minimum path length between said distinct pair of source vertices in the undirected graph.

13. The system of claim 8, wherein the user defined criterion is based on imbalance and difference of the first and second mutually independent groups, wherein the imbalance and the difference are defined as follows:

$$\text{imbalance}=\max(|B|,|W|)/\min(|B|,|W|)$$

$$\text{difference}=\text{abs}(|B|-|W|)/(|B|+|W|+|S|)$$

where:

|B| is the number of vertices in the first independent group,

|W| is the number of vertices in the second independent group,

|S| is the number of vertices in the separator group.

14. The system of claim 13, wherein the user defined criterion further includes first and second user provided parameters for estimating a computational cost indicator of a particular partition scheme as follows: if said imbalance is less than the first parameter, then the computational cost indicator is equal to |S|(1+said difference×the second parameter), otherwise the computational cost indicator is infinite.

15. A non-transitory computer readable storage medium containing computer executable instructions for numerically simulating physical behaviors of a physical domain using a computer-aided engineering (CAE) analysis by a method comprising:

receiving a computerized model representing a physical domain in a distributed memory multi-processor computer system, the computerized model comprising a plurality of nodes connected by a plurality of elements in an unstructured manner, wherein the computerized model contains N degrees-of-freedom associated with the nodes, N is a positive integer;

generating an N×N matrix representing a physical characteristic property of the physical domain from the computerized model using a CAE application module installed on the distributed memory multi-processor computer system, wherein the N×N matrix comprises coefficients of N simultaneous linear equations with N unknown physical quantities of the physical domain, each unknown physical quantity being associated with one of the N degrees-of-freedom;

using an undirected graph containing N vertices connected by a plurality of edges to represent the N×N matrix, the N vertices corresponding to the respective N degrees-of-freedom while the edges representing respective non-zero terms in the N×N matrix;

calculating respective distance vectors of a plurality of source vertices selected from the N vertices;

for each distinct pair of the source vertices, determining a trial partition scheme for dividing the N vertices into a separator group and, first and second mutually independent groups by a) using a half-level set to find a coarse graph whose adjacency coarse matrix is pentadiagonal, the half-level set being the difference of said corresponding distance vectors of the distinct pair, b) initially determining the separator group and, the first and second mutually independent groups using the coarse graph, and c) iteratively improving the separator group by trimming vertices contained therein and merging into one of the first and the second mutually independent groups until the separator group becomes minimal, wherein the first and the second mutually independent groups are unconnected by any of the edges; and comparing all trial partition schemes to determine a best suitable partition scheme based on a user defined criterion that is configured to reduce overall computing resources for solving the N simultaneous linear equations; and obtaining numerically simulated physical behaviors of the physical domain by solving the N unknown physical quantities with the N×N matrix stored in corresponding memory systems of the distributed memory multi-processor computer system according to the best suitable partition scheme.

16. The non-transitory computer readable storage medium of claim 15, wherein said physical behaviors of the physical domain are structural behaviors of a product and said computerized model comprises a finite element analysis model with the elements comprising finite elements.

17. The non-transitory computer readable storage medium of claim 16, wherein the physical characteristic property of the physical domain is stiffness and the unknown physical quantities are displacements at the nodes of the finite element analysis model.

18. The non-transitory computer readable storage medium of claim 15, wherein said selecting a group of source vertices from the N vertices are selected arbitrarily in random.

19. The non-transitory computer readable storage medium of claim 15, wherein the user defined criterion is based on imbalance and difference of the first and second mutually independent groups, wherein the imbalance and the difference are defined as follows:

$$\text{imbalance}=\max(|B|,|W|)/\min(|B|,|W|)$$

$$\text{difference}=\text{abs}(|B|-|W|)/(|B|+|W|+|S|)$$

where:

|B| is the number of vertices in the first independent group,

|W| is the number of vertices in the second independent group,

|S| is the number of vertices in the separator group.

20. The non-transitory computer readable storage medium of claim 19, wherein the user defined criterion further includes first and second user provided parameters for estimating a computational cost indicator of a particular partition scheme as follows: if said imbalance is less than the first parameter, then the computational cost indicator is equal to |S|(1+said difference×the second parameter), otherwise the computational cost indicator is infinite.

* * * * *